United States Patent
Corea et al.

(10) Patent No.: US 10,697,087 B2
(45) Date of Patent: Jun. 30, 2020

(54) SUSCEPTOR WITH SUPPORTING ELEMENT

(71) Applicant: LPE S.P.A., Baranzate (IT)

(72) Inventors: Francesco Corea, Baranzate (IT);
Danilo Crippa, Baranzate (IT); Laura Gobbo, Baranzate (IT); Marco Mauceri, Baranzate (IT); Vincenzo Ogliari, Baranzate (IT); Franco Preti, Baranzate (IT); Marco Puglisi, Baranzate (IT); Carmelo Vecchio, Baranzate (IT)

(73) Assignee: LPE S.P.A., Baranzate (MI) (IT)

( * ) Notice: Subject to any disclaimer, the term of this patent is extended or adjusted under 35 U.S.C. 154(b) by 94 days.

(21) Appl. No.: 15/080,121

(22) Filed: Mar. 24, 2016

(65) Prior Publication Data

US 2016/0201219 A1    Jul. 14, 2016

Related U.S. Application Data

(63) Continuation of application No. PCT/IB2014/001908, filed on Sep. 24, 2014.

(51) Int. Cl.
  *C30B 25/12*   (2006.01)
  *C23C 16/458*  (2006.01)
  *H01L 21/687*  (2006.01)

(52) U.S. Cl.
  CPC .......... *C30B 25/12* (2013.01); *C23C 16/4583* (2013.01); *H01L 21/68735* (2013.01)

(58) Field of Classification Search
CPC combination set(s) only.
See application file for complete search history.

(56) References Cited

U.S. PATENT DOCUMENTS

| | | | |
|---|---|---|---|
| 5,580,388 A | 12/1996 | Moore | |
| 5,813,851 A * | 9/1998 | Nakao | C23C 16/46 432/152 |
| 2003/0114016 A1 | 6/2003 | Tischler | |
| 2006/0275104 A1* | 12/2006 | Speciale | C30B 25/12 414/787 |
| 2013/0213300 A1* | 8/2013 | Sung | H01L 21/68735 118/712 |

FOREIGN PATENT DOCUMENTS

| | | |
|---|---|---|
| EP | 0448346 A1 | 9/1991 |
| EP | 1094502 A2 | 4/2001 |

* cited by examiner

*Primary Examiner* — Erin F Bergner
(74) *Attorney, Agent, or Firm* — King & Schickli, PLLC

(57) ABSTRACT

The present invention mainly relates to a susceptor for a reactor for epitaxial growth, comprising: a disc-shaped body (90) having a first face and a second face, wherein the first face comprises at least one zone (99) adapted to receive a substrate (2000) to be subjected to epitaxial growth and at least one supporting element (91+97) for the substrate (2000), located at the zone (99); the supporting element (91+97) comprises a circular disc (91) with an edge (97) which is raised with respect to the disc; the zone (99) may be a bottom of a recess (99) or a top of a relief of the disc-shaped body (90); the disc-shaped body (90) is solid at least at the recess (99) or relief; the edge is accessible from a side of the susceptor for handling the supporting element.

14 Claims, 9 Drawing Sheets

Figure 2:
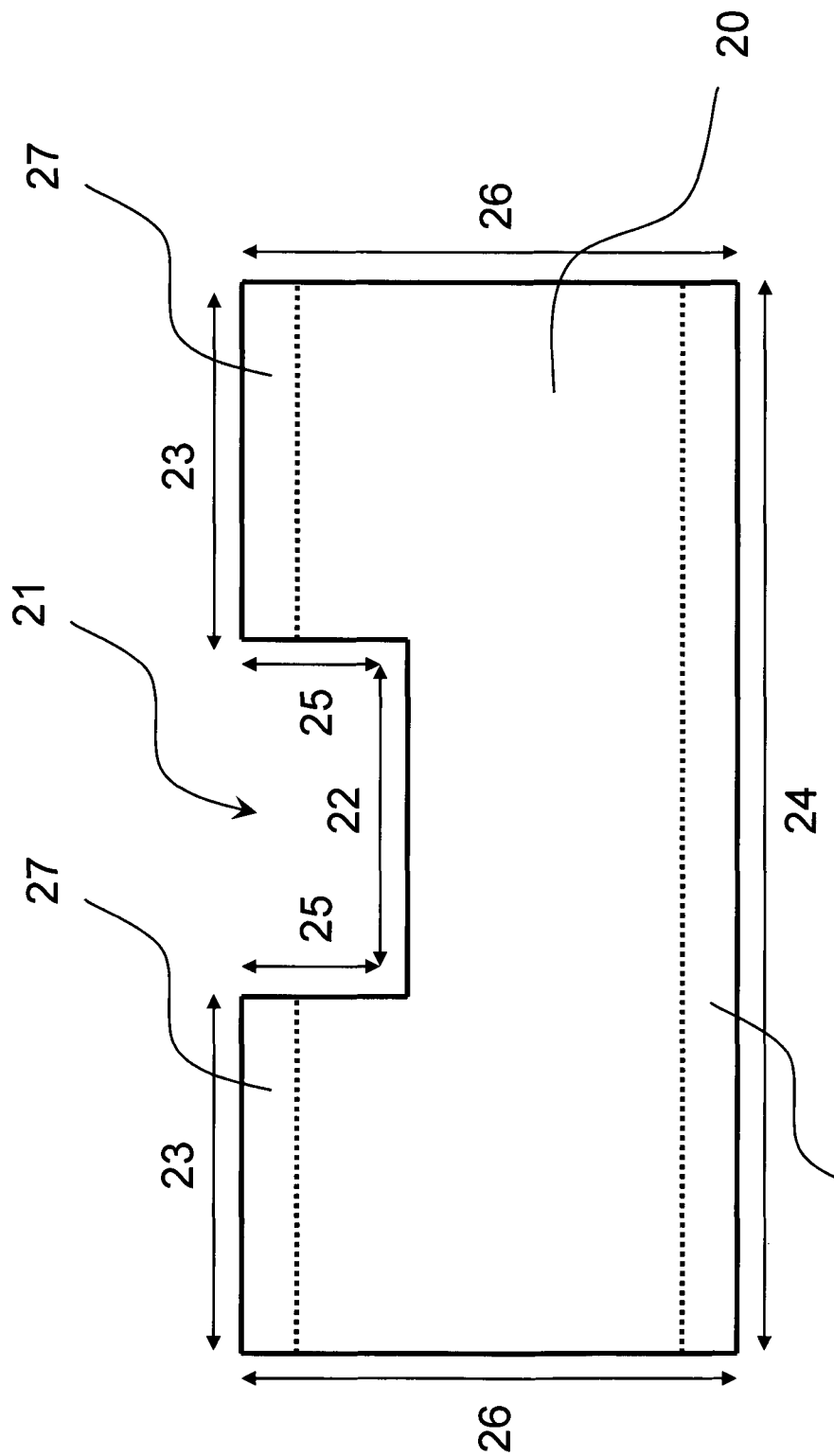

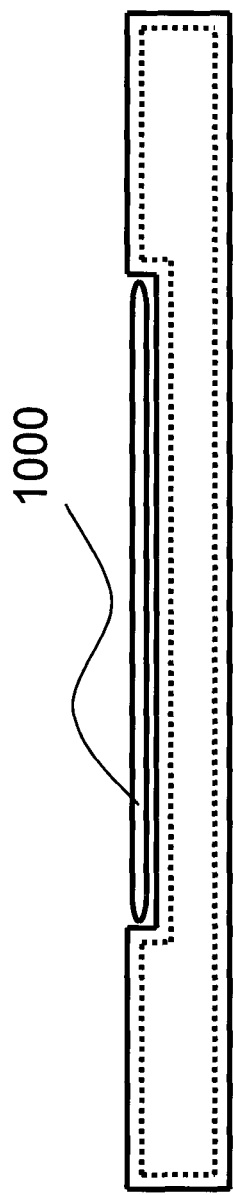
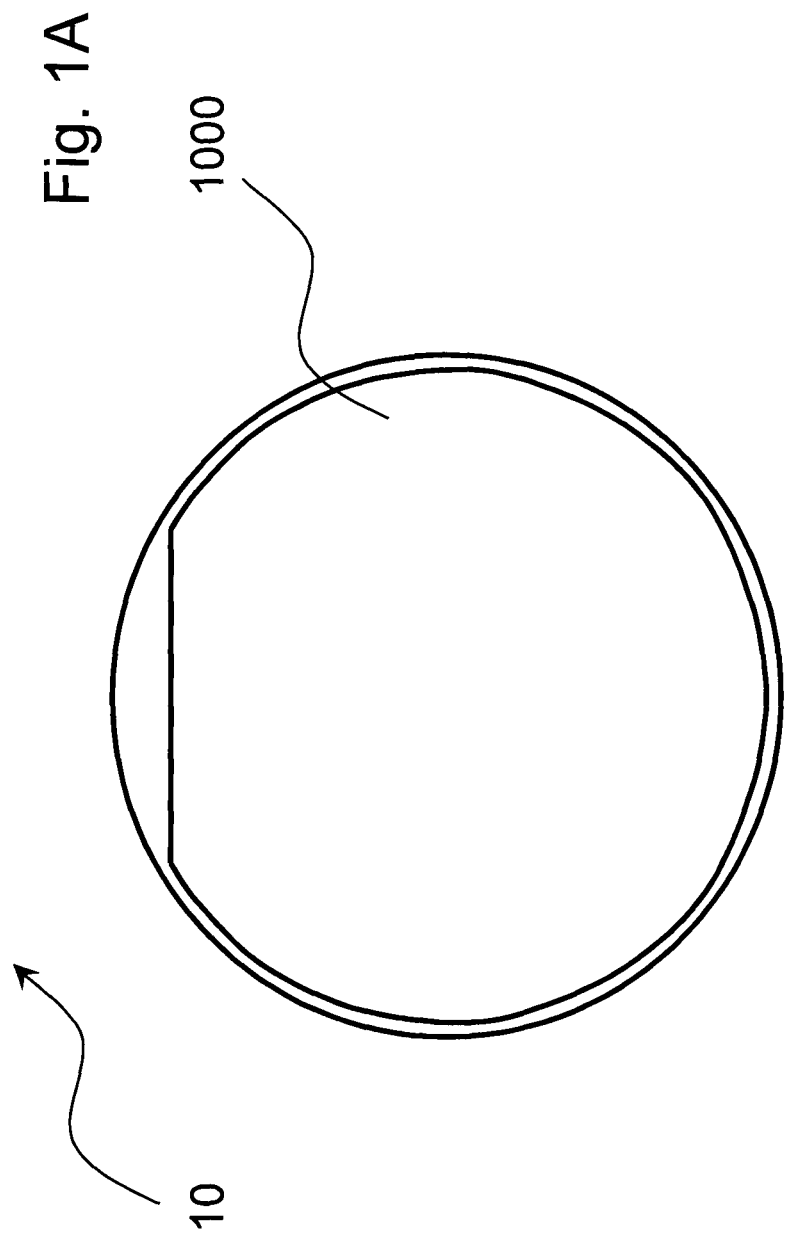
Fig. 1A
Fig. 1B
PRIOR ART

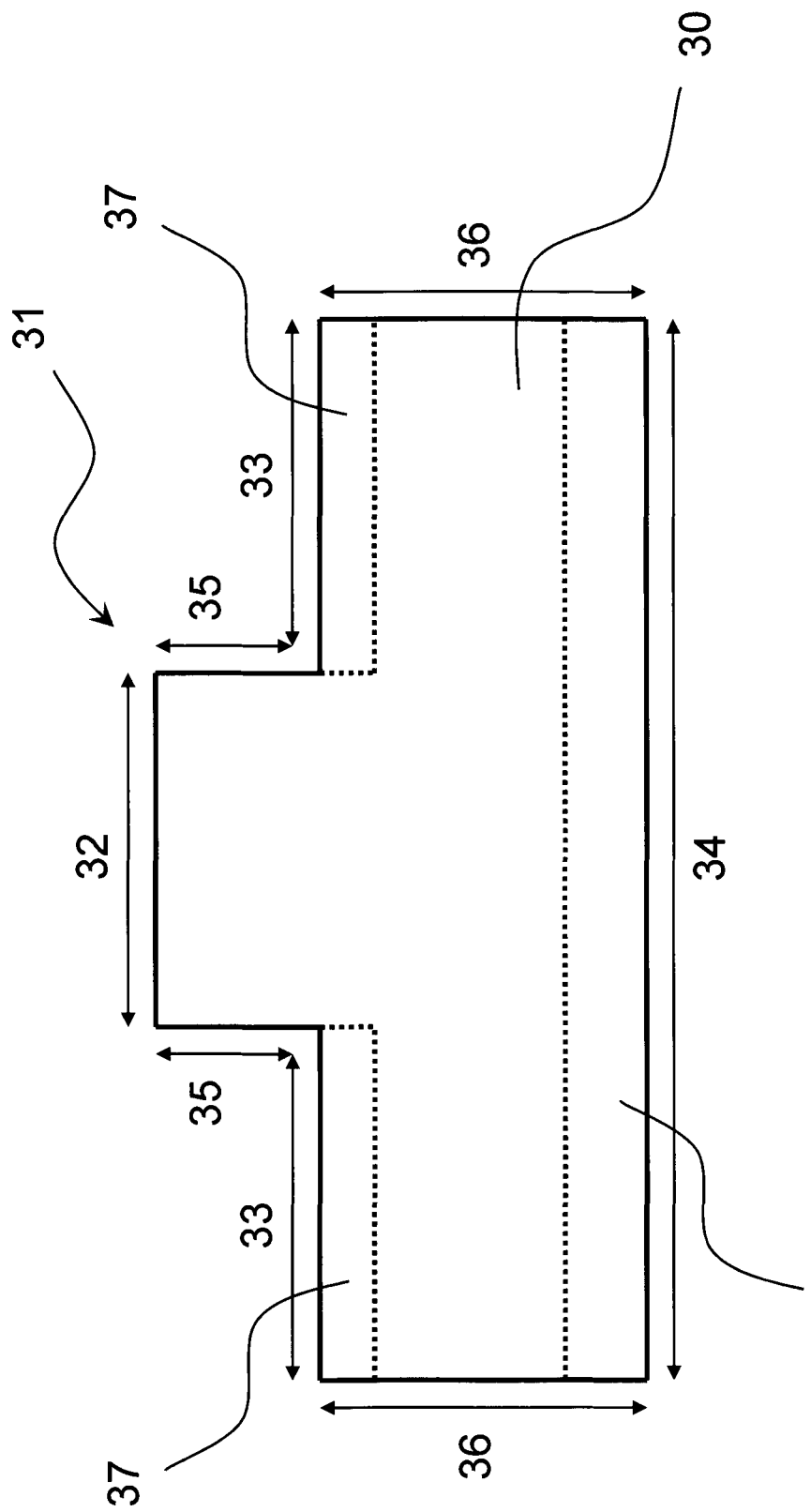

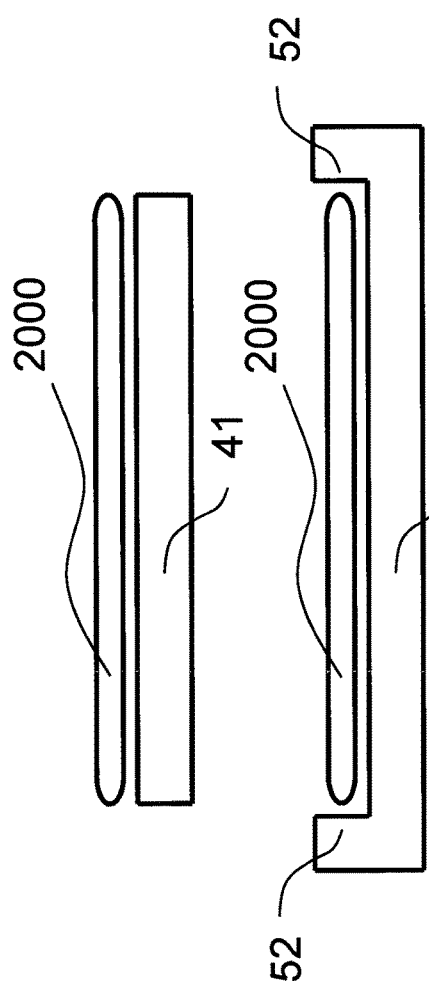
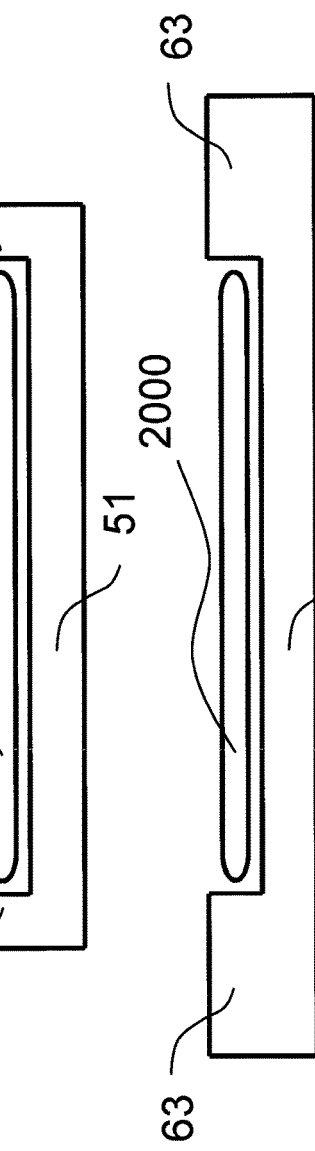
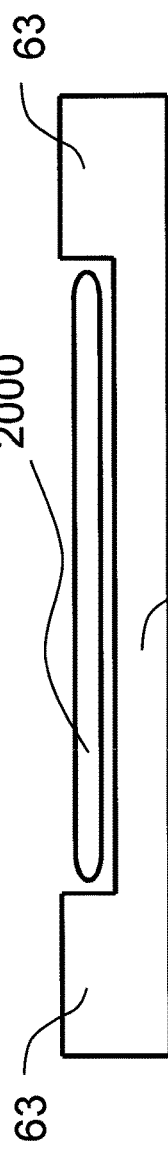
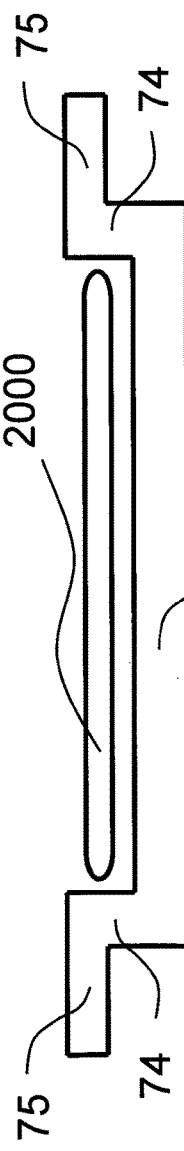
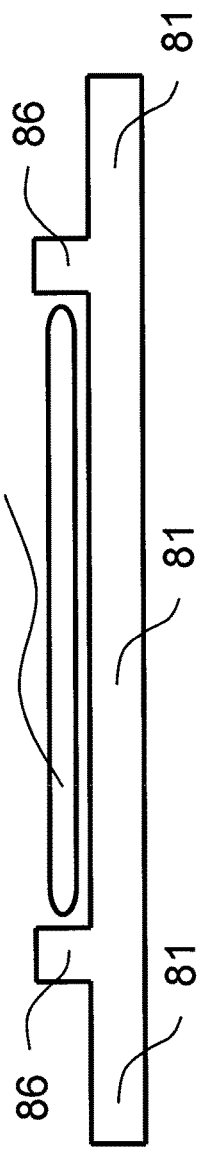

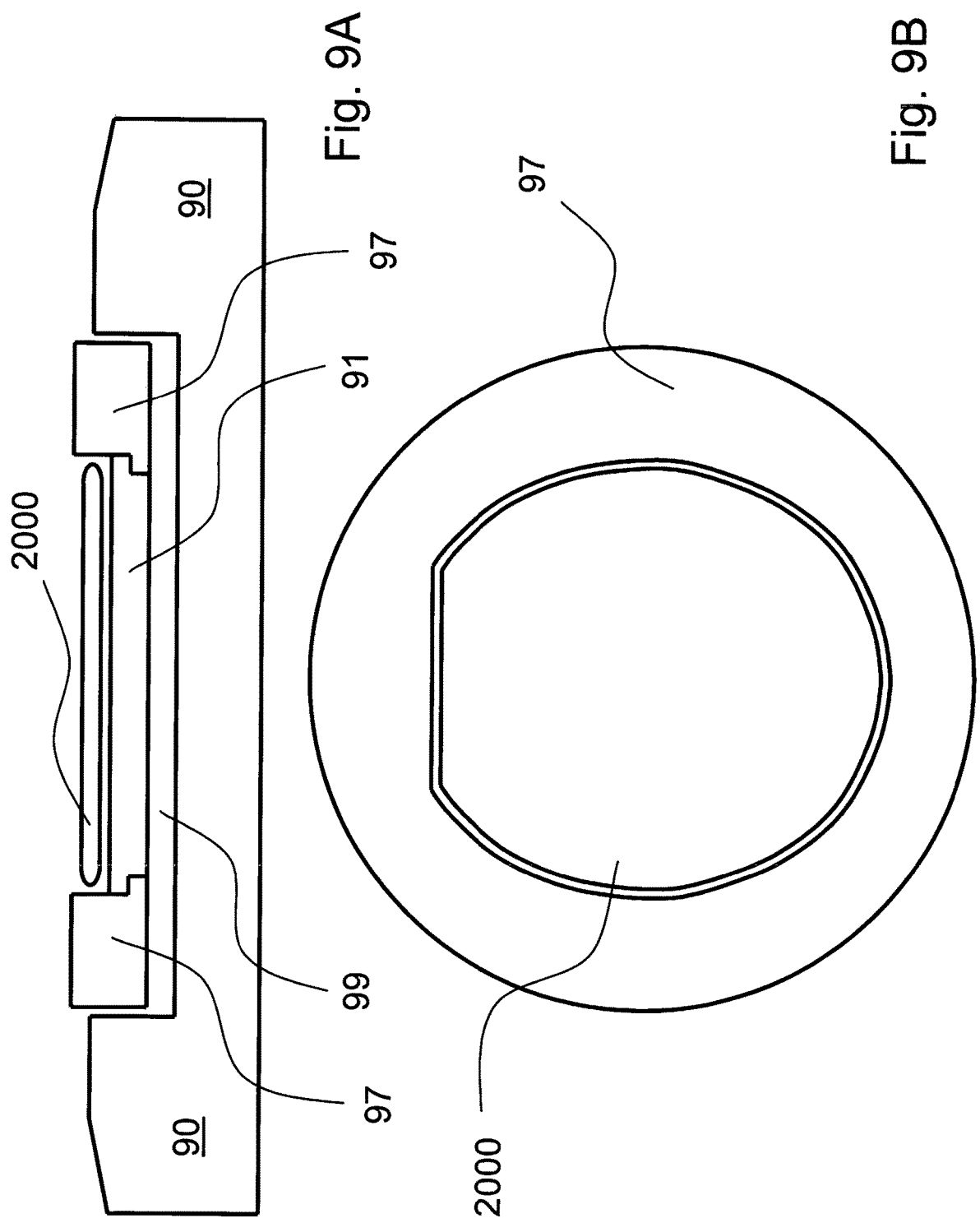

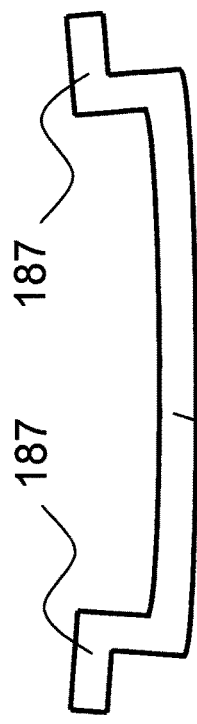
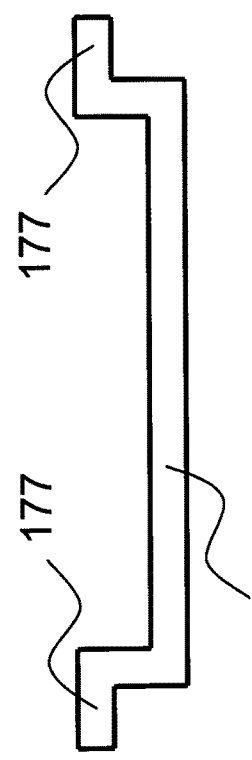
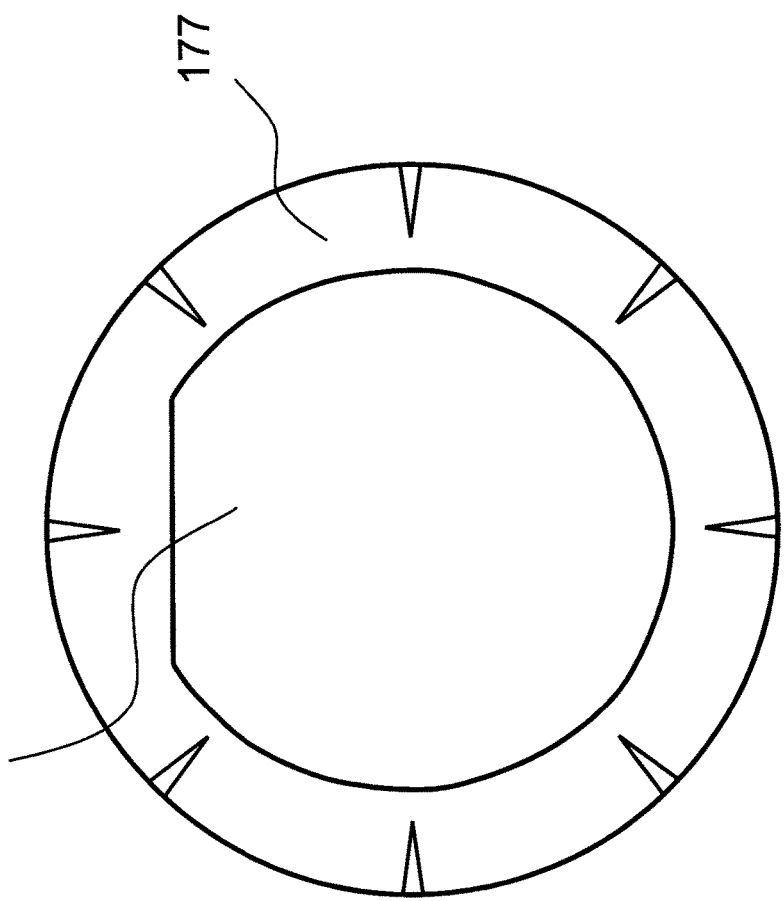

SUSCEPTOR WITH SUPPORTING ELEMENT

This application is a continuation of PCT/IB2014/001908, the disclosure of which is incorporated by reference, and which application qualifies as a U.S. patent application according to 35 USC 363 and contains a certified copy of Italian patent application CO2013A000041, which is also incorporated by reference.

FIELD OF THE INVENTION

The present invention mainly relates to a susceptor with at least one supporting element for receiving substrates to be subjected to "epitaxial growth".

BACKGROUND

Epitaxial growth and the reactors for obtaining it have been known for many decades; they are based on the technique known as "CVD" (Chemical Vapor Deposition).

A technical field in which they are used is that of the production of electronic components; the processes and the reactors for this application are particular because a very high quality of the deposited layers is required and the quality requirements are continuously on the rise.

One type of epitaxial reactor uses a "susceptor" which is inserted in a reaction chamber and which supports one or more substrates to be subjected to epitaxial growth (see reference numerals 10 and 1000 in FIG. 1A); as known, the substrates may be perfectly circular or often with a "flat" (see substrate 1000 in FIG. 1B).

The present invention indeed relates to such a susceptor, in particular for high-temperature (1550-1750° C.) epitaxial growth of silicon carbide.

Typically, reactors with hot wall reaction chamber are used for the high-temperature epitaxial growth of silicon carbide; the heating of the chamber and susceptor is generally obtained by means of electromagnetic induction or resistance.

Most of the prior art (FIG. 1) relates to the epitaxial growth of silicon, with process temperatures up to 1250° C., and to the corresponding reactors; indeed, only rather recently have electronic components of silicon carbide become slightly more widely used.

Frequently, in epitaxial reactors for high-temperature epitaxial growth of silicon carbide, the susceptor is entirely made of graphite and entirely coated by means of the deposition of a thin layer of silicon carbide (in FIG. 1A, the dashed line indicates the boundary between the outer silicon carbide and the inner graphite); furthermore, the susceptor comprises one or more recesses (see the single recess in FIG. 1A with the substrate 1000 inserted therein) in which the substrates to be treated are manually inserted and from which the treated substrates are manually extracted; finally, the susceptor is loaded into the reaction chamber with the substrates to be treated and is unloaded from the reaction chamber with the treated substrates.

SUMMARY

Recently, the Applicant realized that such a solution was no longer satisfactory also in light of the increasingly stringent requirements in terms of grown substrate quality and production process quality and speed.

A greater flexibility is desirable with regard to the support, the heating (more in general, the treatment) and the handling of the substrates (manual or automatic handling).

Furthermore, increasing the productivity of the reactors is desirable, for example by reducing the downtime: ideally, the entire operating time of the reactor should be dedicated to the deposition of epitaxial layers on substrates.

Finally, it is desirable to reduce and/or simplify the maintenance of the reactor and of its components, in particular of the susceptor.

The Applicant thus set the aim to improve the known solutions.

Such an objective is substantially achieved by virtue of a susceptor having the technical features set forth in the appended claims, which form an integral part of the present disclosure.

The idea underlying the present invention is that of using at least one substrate supporting element with a raised edge to be combined with the disc-shaped body of the susceptor; the raised edge is adapted to be used to handle the supporting element, and thus the supported substrates. Such a supporting element may be coupled to a frame; in this case, the frame may also act as a raised edge.

Such a solution was thought to be mainly used in an epitaxial growth reactor; indeed, this is another aspect claimed by the present invention.

A further aspect claimed by the present invention is a method of handling substrates in a reaction chamber of a reactor for epitaxial growth provided with a susceptor for supporting and heating substrates. According to such a method, the susceptor is left permanently in the chamber; before growth, a substrate supporting element or a coupling between a substrate supporting element and a frame is loaded into the chamber; during growth, such an element or such a coupling is left in the chamber; after growth, such an element or such a coupling is unloaded from the chamber.

LIST OF FIGURES

Figure 10:
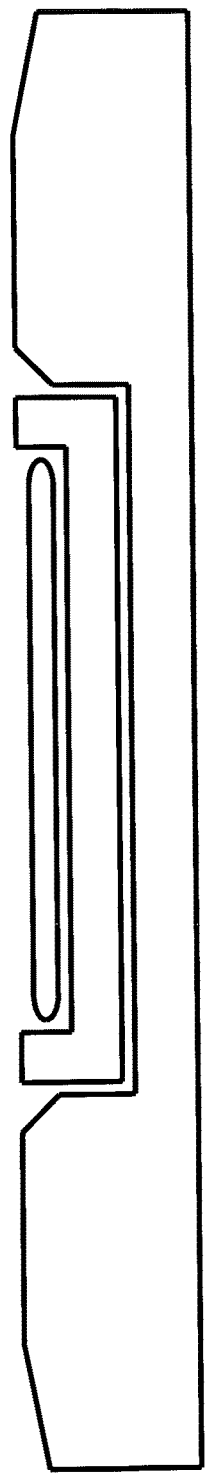
Figure 11:
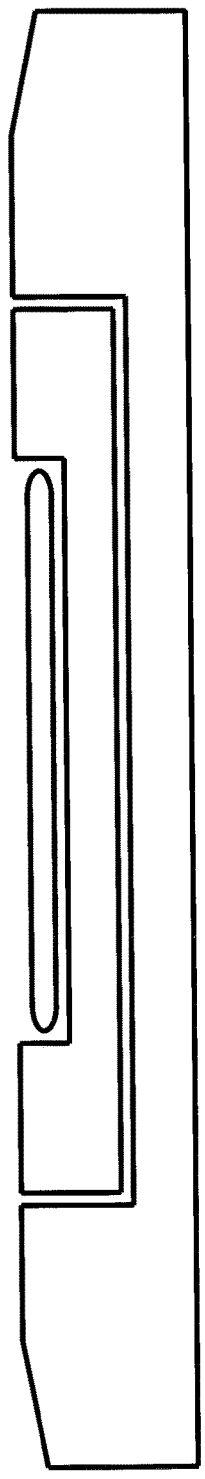
Figure 12:
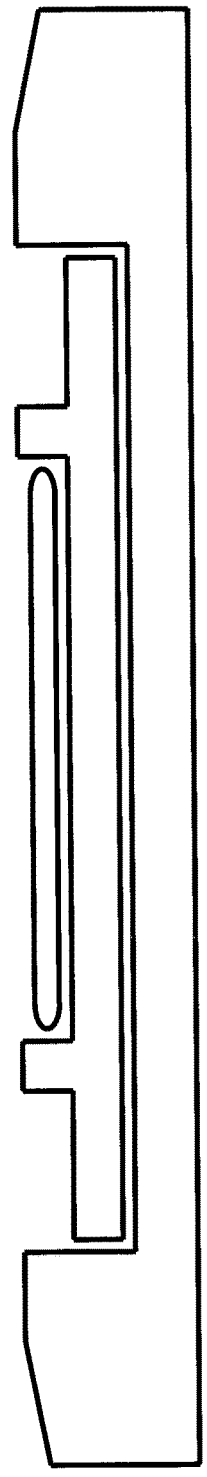
Figure 13:
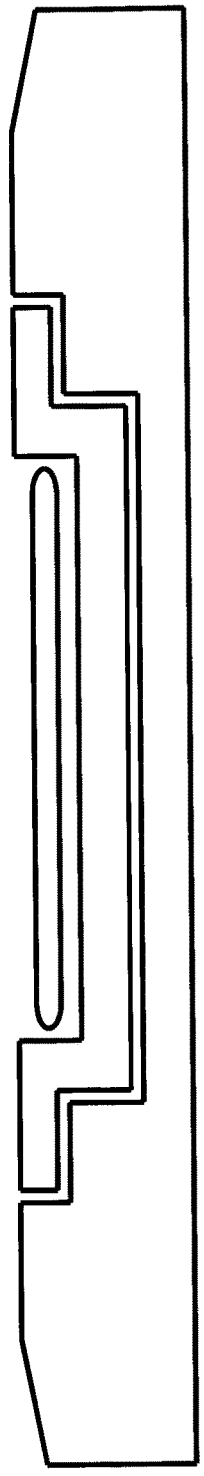
Figure 14:
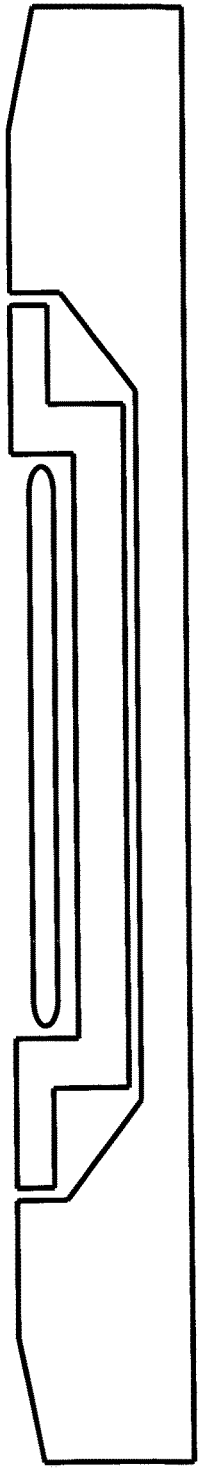
Figure 15:
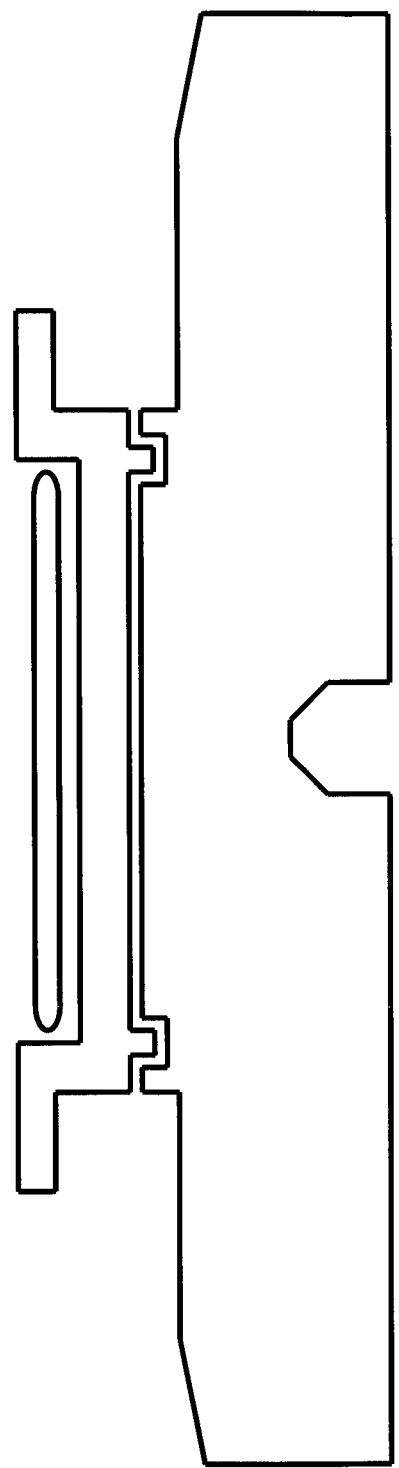
Figure 16:
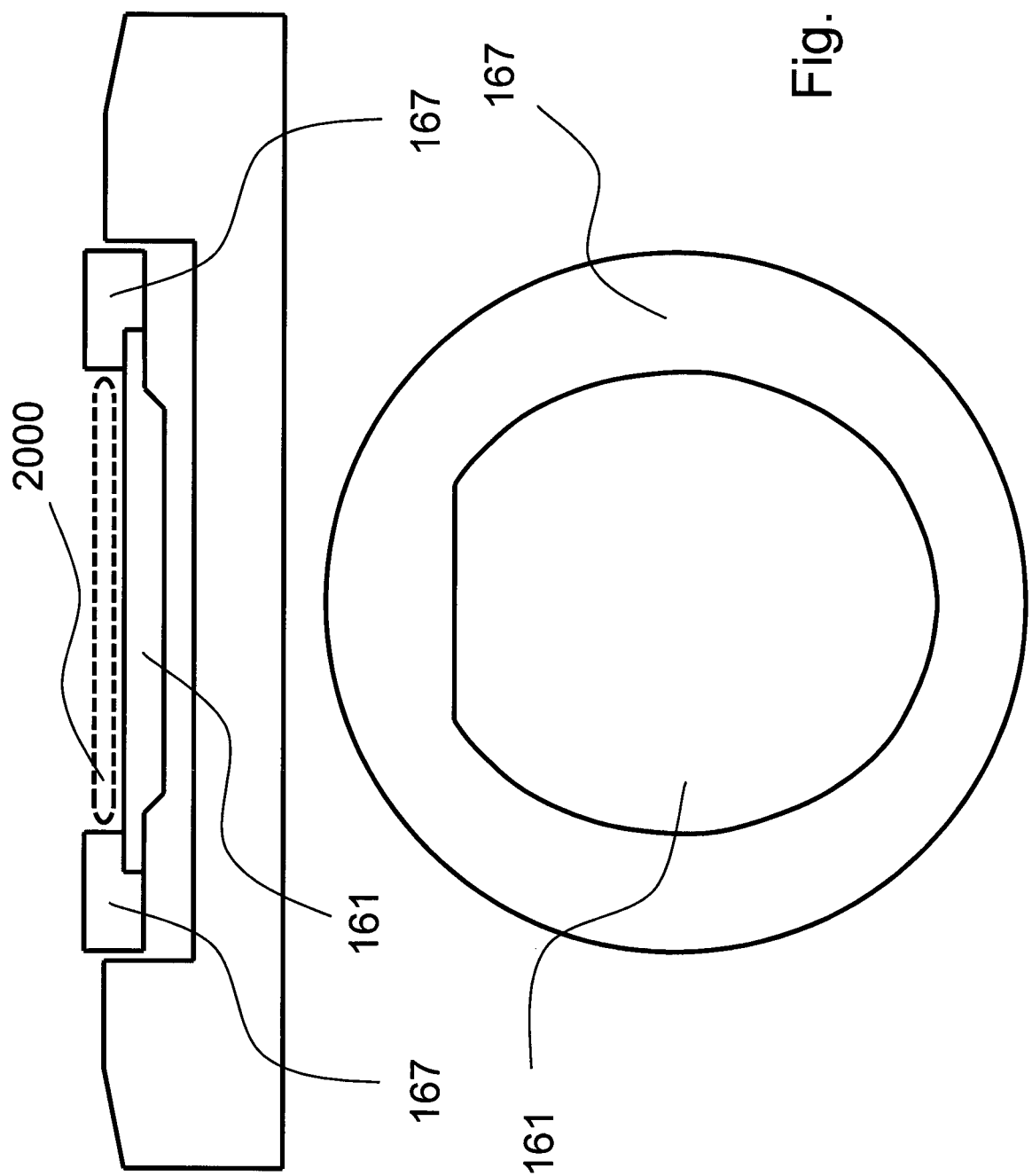

The present invention will become more apparent from the following detailed description to be considered in conjunction with the accompanying drawings, in which:

FIGS. 1A and 1B show a simplified section view and a partial top view of a disc-shaped body of a susceptor according to the prior art with a substrate inserted in a recess thereof, FIG. 2 shows a diagrammatic (section) view of a first example of a disc-shaped body of a susceptor adapted for the present invention—this figure is evidently not in scale, FIG. 3 shows a diagrammatic (section) view of a second example of a disc-shaped body of a susceptor adapted for the present invention—this figure is evidently not in scale, FIG. 4 shows a simplified section view of a first example of a substrate supporting element according to the present invention to be used, coupled with a frame, in combination with a susceptor body, FIG. 5 shows a simplified section view of a second example of a substrate supporting element according to the present invention to be used in combination with a susceptor body, FIG. 6 shows a simplified section view of a third example of a substrate supporting element according to the present invention to be used in combination with a susceptor body, FIG. 7 shows a simplified section view of a fourth example of a substrate supporting element according to the present invention to be used in combination with a susceptor body, FIG. 8 shows a simplified section view of a fifth example of a substrate supporting element according to the present invention to be used in combination with a susceptor body, FIGS. 9A and 9B show a simplified section view and a partial top view of an example of a coupling, according to the present invention, of a supporting element and a frame to be used in combination with a susceptor body (the susceptor body is partially shown, in a simplified manner), FIG. 10 shows a simplified, partial section view of a first combination of a susceptor body and a substrate supporting element according to the present invention, FIG. 11 shows a simplified, partial section view of a second combination of a susceptor body and a substrate supporting element according to the present invention, FIG. 12 shows a simplified, partial section view of a third combination of a susceptor body and a substrate supporting element according to the present invention, FIG. 13 shows a simplified, partial section view of a fourth combination of a susceptor body and a substrate supporting element according to the present invention, FIG. 14 shows a simplified, partial section view of a fifth combination of a susceptor body and a substrate supporting element according to the present invention, FIG. 15 shows a simplified, partial section view of a sixth combination of a susceptor body and a substrate supporting element according to the present invention, FIG. 16 shows a simplified section view and a partial top view of another example of a coupling, according to the present invention, of a supporting element and a frame to be used in combination with a susceptor body (the susceptor body is partially shown, in a simplified manner)—variant of the example in FIG. 9, FIGS. 17A and 17B show a simplified section view and a top view of a variant of the substrate supporting element in FIG. 7, and FIG. 18 shows a simplified section view of a variant of the substrate supporting element in FIG. 7.

Such a description and such drawings are provided by way of mere example and therefore are non-limiting.

It is worth noting that such a description considers various innovative concepts (and ways to implement them) which are independent from one another, but which can be advantageously combined with one another.

As easily apparent, the present invention, the main advantageous aspects of which are defined in the appended claims, can be implemented in various manners.

DETAILED DESCRIPTION

FIG. 2 and FIG. 3 are diagrammatic; in particular, the dimensions of the susceptor bodies are distorted to highlight their details and they have a single zone adapted to receive substrates for simplicity; in actual fact, the susceptor bodies may have one or more zones adapted to receive substrates, typically identical to one another.

It is useful to explain that, in many figures, parts which are adjacent are shown as being slightly spaced apart only to allow to better view their shapes.

FIG. 2 shows a susceptor for a reactor for epitaxial growth consisting of a disc-shaped body 20 entirely made of graphite having a first face and a second face. The body is typically placed within a reaction chamber so as to be horizontal, and thus the first face corresponds to the upper face (and on the front) and the second face corresponds to the lower face (and on the back). The first face comprises a circular-shaped recess 21 (the space corresponding to the recess is substantially a thin cylinder), i.e. a blind hole, adapted to receive a substrate to be subjected to epitaxial growth. As will be more apparent below, the recess may receive the substrates either directly or indirectly, for example, by means of a supporting element; naturally, the size of the recess in the first case is smaller than the size of the recess in the second case. The first face thus exposes a lowered upper surface 22, corresponding to the bottom of recess 21, and a raised upper surface 23, which surrounds recess 21, while the second face exposes a lower surface 24.

The raised upper surface 23 is coated with an exposed layer 27 of silicon carbide.

At least part of the lower surface 24 is coated with an exposed layer 28 of silicon carbide; in FIG. 2, layer 28 entirely coats surface 24 for simplicity of production.

Thereby, the progressive outward curvature of the susceptor can be considerably limited; indeed, it has been empirically verified that the deformations due to the layers of silicon carbide on the upper and lower surfaces tend to compensate each other; this also applies even if, when using the susceptor for processes of epitaxial growth of silicon carbide, further silicon carbide is deposited on the upper surface—naturally, a progressive deformation of the susceptor cannot be entirely avoided also because of such a further deposition.

There are two alternatives with regards to the problem of material migration from the bottom of recess 21.

According to first alternative (shown in FIG. 2), the entire lowered upper surface 22 is coated with an exposed layer of graphite; such a layer typically corresponds to the graphite of the disc-shaped body. Indeed, the evolution of materials has led to obtain graphite of excellent quality, and thus the possible minor contamination due to the graphite, in particular of the contained impurities, is not harmful.

According to the second alternative (not shown in FIG. 2), the entire lowered upper surface is coated with an exposed layer of tantalum carbide. Indeed, the sublimation of tantalum carbide is negligible at the epitaxial growth temperatures of silicon carbide (1550-1750° C.).

Furthermore, it was thought to make susceptors entirely of sintered silicon carbide because these could have avoided substantial problems of migration of material towards the superimposed substrates or substantial problems of deformation during use. However, such a solution was rather costly, taking into account the fact that the susceptor must be replaced after a given period of use.

By way of example, the size of the disc-shaped body of the susceptor may be: diameter 200-400 mm, thickness 5-10 mm, diameter of the recess 100-200 mm, depth of the recess 1-4 mm, number of recesses from 1 to 10; by way of example, the size of the substrates of silicon carbide (homoepitaxial growth) may be: thickness of 250-500µ and diameter of 100-200 mm; in general, the processes of epitaxial growth of silicon carbide for electronic applications include depositions of 2-20µ, which however may be extended to 100µ and more.

In the example shown in FIG. 2, the layer 27 of silicon carbide on the upper surface 23 reaches the inner side 25 of recess 21; in the example shown in FIG. 2, the layer 27 of silicon carbide on the upper surface 23 reaches the outer side 26 of the disc-shaped body 20; typically and as shown in FIG. 2, both such features are achieved.

Typically, the lower surface 24 is flat, the raised upper surface 23 is flat, and the lowered surface 22 is either perfectly flat or slightly concave.

The lower surface 24 may be coated with a layer of silicon carbide either entirely or only in an annular zone or only in a central zone; indeed, compensation for deformation is the most important aspect.

Instead, with regards to the upper surface 23 of the susceptor, a complete coating is by far preferable; indeed, when the susceptor is used for processes of epitaxial growth of silicon carbide, silicon carbide is thus deposited again and only on the silicon carbide underneath.

Thus, it can be expected that the thickness of the silicon carbide on the susceptor is uniform (i.e. independent from the horizontal position) and remains uniform during the entire life of the susceptor. Furthermore, it may be expected that the silicon carbide has uniform physical features on top (regardless of the horizontal position and of the vertical position).

The thickness of the layer of silicon carbide on the lower surface 24 may be, for example, in the range from 10μ to 100μ for the entire life of the susceptor.

The thickness of the layer of silicon carbide on the upper surface 23 may be, for example, in the range from 10μ to 100μ for the entire life of the susceptor; at the end of the life of the susceptor (i.e. before possible maintenance thereof), such a thickness may reach and even exceed 1000μ.

In general, the thickness of the layer of silicon carbide on the upper surface 23 may be either equal to or different from the thickness of the layer of silicon carbide on the lower surface 24. However, experiments were carried out and better results were obtained when the thickness of the layer of silicon carbide on the upper surface 23 was greater than the thickness of the layer of silicon carbide on the lower surface 24, probably because the area of the upper layer 27 is smaller than the area of the lower layer 28 due to the presence of recess 21. According to one of these experiments, a susceptor entirely made of graphite was treated directly in the reaction chamber of the epitaxial reactor; firstly, it was degassed for several minutes at a temperature of about 1650° C. under a hydrogen flow, then a "sacrificial substrate" was placed in the recess, then about 20μ were deposited on the upper surface 23 (and on the "sacrificial substrate"), then the "sacrificial substrate" was removed from the recess, then the susceptor was turned and about 10μ were deposited on the lower surface 24, then the susceptor was turned, the "sacrificial substrate" was placed in the recess and about 20μ were deposited on the upper surface 23 (and on the "sacrificial substrate"), finally the "sacrificial substrate" was removed from the recess; such a susceptor provided excellent results from all points of view during its entire life. It is worth noting that the properties of the layers of silicon carbide produced during the initial treatment of the susceptor were influenced by the production method.

Variants of the solution diagrammatically shown in FIG. 2 are possible.

The inner side 25 of the recess 21 may be coated with an exposed layer of silicon carbide.

The outer side 26 of the disc-shaped body 20 may be coated with an exposed layer of silicon carbide.

The lowered upper surface 22 (smooth in FIG. 2), may be at least in part rough or rugged or knurled.

Recess 21, which is a blind hole, may house a substrate supporting element (see FIG. 10, FIG. 11, FIG. 12, FIG. 13, FIG. 14) instead of only one substrate; such an element may be stably laid at the bottom 22 of recess 21.

The recess of the disc-shaped body of the susceptor may have a radial, annular widening on top and/or at the bottom (see FIG. 13 and FIG. 14). Such a widening, in particular the upper widening, may be used to house a corresponding widening of the supporting element (see FIG. 13 and FIG. 14); as will be explained below, such a widening, in particular the lower widening, may have other purposes.

Recess 21 may house the combination of a substrate supporting element (see reference numeral 91 in FIG. 9) and a frame for the supporting element (see reference numeral 97 in FIG. 9) instead of either only a substrate or only a substrate and a supporting element; such a frame may be inserted in recess 21 and then stably laid at the bottom 22 of recess 21.

As mentioned, the hole corresponding to the recess of the susceptor is blind because the (indirect) handling of the substrates is performed from the upper face of the susceptor and/or the side of the susceptor.

FIG. 3 shows a susceptor for a reactor for epitaxial growth which is very different from that shown in FIG. 2. With regards to the coating of the graphite body, the susceptor in FIG. 3 is similar (but not identical) to that in FIG. 2 and thus considerations similar to those already made for the susceptor in FIG. 2 apply.

It consists of a solid disc-shaped body 30 entirely of graphite having a first face and a second face. The first face comprises a circular-shaped relief 31 (the space corresponding to the relief is substantially a thin cylinder) adapted to receive a substrate to be subjected to epitaxial growth.

The reference numerals in FIG. 3 have the following meaning: reference numeral 32 corresponds to a raised upper surface of the top of relief 31, reference numeral 33 corresponds to a lowered upper surface which surrounds relief 31, reference numeral 34 corresponds to a lower surface, reference numeral 35 corresponds to an outer side of relief 31, reference numeral 36 corresponds to an outer side of the disc-shaped body 30, reference numeral 37 corresponds to a layer of silicon carbide on the upper surface 33, reference numeral 38 corresponds to a layer of silicon carbide on the lower surface 34. The analogy or duality between reference numerals 20, 21, 22, 23, 24, 25, 26, 27, 28 and reference numerals 30, 31, 32, 33, 34, 35, 36, 37, 38 is apparent; however, it is worth noting that while the side 25 is inner and thus potentially not directly exposed to the precursor gases, the side 35 is outer and thus typically exposed to the precursor gases (unless particular measures are taken, for example protection elements outside the susceptor).

Relief 31, as recess 21, may also receive the substrates either directly or indirectly, for example by means of a supporting element (see FIG. 15) or the combination of a substrate supporting element and a frame for the supporting element; such a frame may be mounted on the relief 31 and then stably laid on the top 32 of relief 31 (see FIG. 15 for similitude).

Relief 31 may have a height, by way of example, in the range from 1 mm to 6 mm.

It is worth noting that the surface 32 of the top of relief 31 may be either perfectly flat or slightly concave and smooth or rough or rugged or knurled.

The surface 32 may be shaped further; for example, there could be at least one recess and/or at least one relief to allow a stable mechanical coupling between susceptor body and substrate supporting element (see FIG. 15) or susceptor body and frame.

Reference was previously made to substrates to be subjected to epitaxial growth. Such supports are thought and designed to be used in combination with a susceptor body; such a combination forms a susceptor which is more complex than the usual susceptors according to the prior art (see FIG. 1). The disc-shaped bodies in FIG. 2 and FIG. 3 are certainly suited to the purpose, even if the supporting elements which will be described in detail thereinafter may be used with susceptor bodies different from these.

The susceptor body to be combined with one or more supports substantially consists of a typically solid disc-shaped body having a first face and a second face; the first face comprises at least one zone adapted to receive a substrate, i.e. a supporting element for a substrate, indirectly.

The supporting element is placed in this zone; for example, in case of a recess, the supporting element is typically inserted in the recess and then laid at the bottom thereof (see FIG. 10, FIG. 11, FIG. 12, FIG. 13, FIG. 14); in the case of a relief, the supporting element is typically mounted on the relief and laid on the top (see FIG. 15).

The susceptor body is solid at least at the recess or relief; in the case of a recess, it is solid at least in the space (under the bottom) between the bottom of the recess and the back of the susceptor (see figures from FIG. 10 to FIG. 14, for example); in the case of a relief, it is solid at least in the space (under the top) between the top of the relief and the back of the susceptor (see example in FIG. 15). Indeed, as will be more apparent below, the (indirect) handling of the substrates is performed on the upper face of the susceptor and/or from the side of the susceptor.

Figures from FIG. 4 to FIG. 9 also show a substrate 2000 for a better understanding thereof; the substrate 2000 is made of silicon carbide because this is the most typical application of the present invention, although the present invention is not limited to silicon carbide substrates; the substrate 2000 has a flat because this is typical, even if the present invention is not limited a substrates with a flat.

The supporting element comprises at least one circular disc.

In the case of the example in FIG. 4, the element consists of a flat circular disc 41; the surface of the disc 41 on which the substrate 2000 rests may be either perfectly flat or slightly concave; the diameter of the disc is slightly larger than the diameter of the substrate, for example greater than 1-3 mm; by way of example, the thickness of the disc 41 may be in the range from 1 mm to 3 mm. This solution is provided when the supporting element is coupled to a frame, as shown for example in FIG. 9.

The supporting element comprises, besides the exception mentioned in the previous paragraph, a circular disc with an annular edge which is raised with respect to the disc; thereby, a recess in which substrates may be housed is defined; the raised edge is made to be accessible from the first face (upper and on the front) of the susceptor and/or from a side of the susceptor for handling the supporting element.

In case of the example in FIG. 5, the element consists of a flat circular disc 51 with a raised edge 52; the thickness of the raised edge is uniform and approximately equal to the thickness of the disc, i.e., by way of example, 1-3 mm. Again by way of example, the total thickness of the element may be in the range from 2 mm to 4 mm and the depth of the recess may be in the range from 250µ to 1000µ.

In case of the example in FIG. 6, the element consists of a flat circular disc 61 with a raised edge 63; the thickness of the raised edge is uniform and high, i.e., by way of example, 3-10 mm. Again by way of example, the total thickness of the element may be in the range from 2 mm to 4 mm and the depth of the recess may be in the range from 250µ to 1000µ.

The raised edge has a lower portion and an upper portion, which are different to each other; the two portions are adjacent to each other and the lower portion is adjacent to the circular disc.

In the case of the example in FIG. 7, there is a flat circular disc 71 and the upper portion 75 of the edge, raised with respect to disc, projects radially outwards with respect to the lower portion 74; furthermore, both the portion 74 and the portion 75 are annular. By way of example, the total thickness of the element may be in the range from 2 mm to 6 mm, the protrusion of the upper portion may be in the range from 3 mm to 10 mm, the thickness of the upper portion may be in the range from 1 mm to 3 mm, and the depth of the recess may be in the range from 250µ to 1000µ.

In the case of the example in FIG. 8, the element consists of a circular flat disc 81 and a circular ring 86; the ring 86 is joined to the circular disc 81 at the upper surface thereof and is distant from the (outer) shape of the disc 81; it can thus be said that the ring is a raised edge retracted with respect to the shape. By way of example, the thickness of the ring may be in the range from 1 mm to 3 mm, the distance between the (outer) shape of the disc and the ring may be in the range from 3 mm to 10 mm, the total thickness of the element may be in the range from 2 mm to 4 mm and the depth of the recess may be in the range from 250µ to 1000µ.

The following considerations apply in general for all supporting elements.

The diameter of the recess defined within the supporting element is typically slightly greater than the diameter of the substrate, for example greater than 1-3 mm; the depth of the recess defined within the supporting element is typically slightly greater than the thickness of the substrate and is, for example, between 250µ to 1000µ.

The raised edge (for example the edge 52, the edge 63, the edge 74 and 75, and similarly the ring 86) may be either circular or shaped, for example shaped so as to be complementary to the outer shape of the substrate (see FIG. 9B for example).

The supporting element exposes a resting surface for the substrates, for example made of graphite or tantalum carbide. Such a surface may be smooth, or alternatively, at least in part rough or rugged or knurled. Such a surface may be flat or alternatively slightly concave.

The supporting element be either entirely made of graphite, or entirely made of tantalum carbide, or made of graphite coated with tantalum carbide; it is worth noting that tantalum carbide is an expensive material, much more expensive than graphite.

The solutions in which the entire outer surface of the supporting element is made graphite and/or tantalum carbide are particularly suited to the cases in which the element is not directly exposed to precursor gases and thus silicon carbide is not deposited thereon during the epitaxial growth processes; the example in FIG. 4 typically falls into one of these cases; the example in FIG. 5 could fall into one of these cases if the thin upper thickness of the raised edge 52 is ignored.

Alternatively, the supporting element may be made of graphite coated at least in part with silicon carbide; the possible coating does not concern the surface on which the substrate, which is made of graphite or tantalum carbide, rests.

Such solutions are particularly suited to the cases in which the element is directly exposed to the precursor gases and thus silicon carbide is deposited thereon, during the epitaxial growth processes. The examples in FIG. 6, FIG. 7 and FIG. 8 typically fall into these cases; figures from FIG. 11 to FIG. 14 show an upper surface of the support which is directly exposed to the precursor gases; FIG. 15 shows an upper surface and an outer side surface of the support which are directly exposed to the precursor gases (less particular measures).

Such a partial coating of silicon carbide is useful for limiting the outward gradual curvature of the supporting element caused by the deposition of silicon carbide. With this regard, the considerations made in connection to the disc-shaped susceptor body and to the layers of silicon carbide apply. Thus, it is advantageous for the entire exposed upper surface (i.e. which does not support a substrate) of the supporting element to be coated with a layer of silicon carbide and for at least part of the lower surface of the supporting element to be coated with a layer of silicon carbide; for example, the lower surface of the circular disc may be coated either entirely, or only in an annular zone, or only in a central zone. In the case of raised edge (see FIG. 7), a layer of silicon carbide could be located, alternatively or additionally, on the back of the disc, on the outer lower side of the edge and/or on the back of the protrusion.

FIG. 9 shows the coupling of a supporting element 91 and a frame 97 which surrounds it; in FIG. 9A, such a coupling is shown during a step of inserting in a recess 99 of the body 90 of the susceptor and, subsequently, will stably lay at the bottom of recess 99; at the end of the operation, the supporting element 91 will also be stably laid at the bottom of recess 99; alternatively, the supporting element 91 may be slightly spaced apart (for example 0.5 mm) from the bottom of recess 99. The element 91 in FIG. 9 resembles the element 41 shown in FIG. 4 but there is a groove to couple with the frame 97 on the lower face. The element+frame coupling in FIG. 9 resembles the supporting element in FIG. 6 as a whole; in this sense, it may be said that the raised edge of the circular disc belongs to the frame.

In general, the frame comprises a hole and the supporting element is inserted, typically stably, in the hole; the frame (together with the element) is placed at a specific zone, for example a recess (as shown in FIG. 9—see FIG. 9A) or a relief of the susceptor body; typically, it is stably laid (as shown in FIG. 9—see FIG. 9A); the hole may be through (as in FIG. 9—see FIG. 9A) or blind; the hole may be either circular or shaped (as shown in FIG. 9B—see FIG. 9B), for example shaped so as to be complementary with the outer shape of the substrate.

The frame may be advantageously made of graphite (either totally or partially) coated with silicon carbide or entirely of silicon carbide. In case of partial coating, it is advantageous to provide a layer of silicon carbide which entirely coats the upper surface of the frame and layer of silicon carbide which entirely coats the lower surface of the frame for the reasons explained above; the thickness of the two layers may be advantageously the same.

Advantageously, the supporting element be entirely made of graphite or entirely made of tantalum carbide or made of graphite entirely coated with tantalum carbide. Differentiating the material between frame and supporting element is evidently very advantageous.

In general, the supporting element and/or the frame may advantageously comprise an inner side with a surface which is partially cylindrical and partially flat (FIG. 9B—this could also applied to the figures from FIG. 4 to FIG. 8).

A variant of the solution in FIG. 9 is shown in FIG. 16; also in this case, there is a coupling between a circular disc 161 and a frame 167; also in this case, the frame comprises a hole and the supporting element is inserted in the hole; also in this case, it may be said that the raised edge of the circular disc belongs to the frame. The difference is in that, in the case of FIG. 9, the handling of the coupling is carried out by acting on the frame, whereas in the case of FIG. 16, the handling is carried out by acting on the supporting element.

The figures (FIG. 10, FIG. 11, FIG. 12, FIG. 13, FIG. 14, FIG. 15) show a series of examples of combinations of a susceptor body and a substrate supporting element; other combinations are possible. In figures FIG. 10, FIG. 11, FIG. 12, FIG. 13, FIG. 14, the element is stably placed at a recess of the body; the depth of the recess of the body corresponds to the total thickness of the supporting element. In FIG. 15, the element is stably placed at a slight relief of the body.

Advantageously, all the bodies have an outer bevel on the upper face of the body at the edge.

In the example in FIG. 10, the supporting element corresponds to the supporting element in FIG. 5; the body of the susceptor has a bevel on the upper face of the body at the recess.

In the example in FIG. 11, the supporting element corresponds to the supporting element in FIG. 6.

In the example in FIG. 12, the supporting element corresponds to the supporting element in FIG. 8.

In the example in FIG. 13, the supporting element corresponds to the supporting element in FIG. 7; the recess has a radial, annular widening which starts at a given distance from the bottom of the recess; the shape of the recess is complementary to the outer shape of the supporting element.

In the example in FIG. 14, the supporting element corresponds to the supporting element in FIG. 7; the recess has a radial, annular widening which starts at the bottom of the recess; therefore, there is a gap between the inner side of the recess and outer side of the supporting element; in this example, such a gap has a triangular section but other shapes are alternatively possible.

In the example in FIG. 15, the supporting element corresponds to the supporting element in FIG. 7; in this example, the diameter of the top of the relief corresponds to the diameter of the disc of the supporting element, even if this is not indispensable. In FIG. 15, the surface of the relief is shaped to obtain stable mechanical couplings; in particular, it has an annular groove in which a ring is inserted which projects from the lower surface of the supporting element so that the body with relief and the supporting element are well coupled to one another. FIG. 15 also shows the lower face of the body of the susceptor; in general, this comprises a seat adapted to receive a pin for guiding the rotation of the susceptor.

In all these examples of combinations, the raised edge of the circular disc is created to be access from the first face (upper and on the front) of the susceptor and/or from a side of the susceptor for handling the supporting element.

Some further variants of the above-described examples are described below by way of example.

The supporting element in FIG. 17 is very similar to the supporting element in FIG. 7; it differs in that the annular protrusion 177 (corresponding to element 75 in FIG. 7) has a plurality of radial cuts; eight are shown in the figure, but there could be a number typically from four to twenty-four; they are shown having a triangular shape in the figure, but they could have any different shape; in the figure, they have a length (in particular, all the same length) such to reach the vertical portion of the raised edge, but they could have a different length. Such cuts may contribute to solving the problem of the outward curvature of the supporting element (i.e. the trend to bulge, i.e. become convex); indeed, the gradual accumulation (process after process) of silicon carbide on the annular protrusion 177 may cause a slight, gradual downward curvature of protrusion 177 (specifically of the various tongues defined by the radial cuts) but a much smaller, or even no, outward curvature of the circular disc 171 (i.e., such that the central zone is raised with respect to the peripheral zone.

The technical teaching underlying the variant in FIG. 17 may also be applied to the solution in FIG. 15.

FIG. 18 shows another variant of the supporting element in FIG. 7 again aimed at solving the problem of the outward curvature of the supporting element. Such a supporting element has an initial counter-curvature; by first approximation, it can be said that the raised edge and its protrusion 187 are equal to those shown in FIG. 7, whereas the circular disc 181 is slightly concave. Thereby, the gradual accumulation (process after process) of silicon carbide on the protrusion 187 causes a gradual outward curvature of the supporting element, and thus a gradual total flattening of the supporting element.

The technical teaching underlying the variant in FIG. 18 may also be applied to the solution in FIG. 15.

Using supporting elements or element+frame couplings extends the life of the susceptor body; indeed, maintenance (for example for removing the deposited silicon carbide) and/or the replacements concentrates thereon. For maintenance purposes, the element+frame coupling is advantageous because such a supporting element which is always protected practically does not require maintenance.

Using supporting elements or element+frame couplings provides flexibility; indeed, the shape of the recess or relief of the body of the susceptor is substantially independent from the shape and/or size of the substrate. Incidentally, different supporting elements may be associated to the same recess or relief of the body of the susceptor, in particular with recesses of different shape and/or size (for example complementary to the other shape of different substrates).

As mentioned, the laying surface may be advantageously at least in part either rough or rugged or knurled. This processing tends to avoid sticking with the superimposed body and/or slipping of the superimposed body.

According to how the present invention is implemented, such a consideration may apply either to the surface of the susceptor on which the substrates lay, or to the surface of the supporting element on which the substrates lay, or to the surface of the susceptor on which the supporting elements lay.

Such susceptors are simultaneously used to support and heat the substrates which are subject to epitaxial growth.

In case of high-temperature epitaxial growth of silicon carbide, the susceptor is placed within a reaction chamber of the hot wall type; typically, the heating is of the induction type and allows to heat the walls of the chamber and the susceptor simultaneously.

In some types of reactors, the reaction chamber has a recess adapted to contain a susceptor both when it is stationary and when it is rotating; typically, this wall is solid at least at the recess, i.e. under the bottom thereof.

In some types of reactors, there is a rather small gap between the lower wall and the upper wall of the chamber; it may be, for example, a parallelepiped of a few centimeters in height; the disc-shaped body of the susceptor is normally inserted in a recess of the lower wall of the chamber in which it may rotate about its axis.

In some types of reactors, the rotation is obtained by means of a specific gas flow (i.e. there is no shaft which transmits a rotary motion to the susceptor); for this reason, the horizontal position of the susceptor in the chamber is known with an accuracy of a few millimeters and the horizontal position of the substrate in the recess is known with an accuracy of a few tenths of a millimeter; furthermore, in general, it is not possible to know either the angular position of the susceptor or the angular position of the substrates. Because of these position uncertainties, it is not easy to handle the substrates above all when they are in the chamber.

With regards to the handling of the substrates, the present invention advantageously includes the possibility of handling the supporting elements and/or the element+frame couplings.

This means that it is no longer necessary to load and unload an entire susceptor, which is cumbersome and heavy, with the substrates.

This means that it is possible to unload the substrates (together with the supporting elements or the element+frame couplings), without damaging them, at rather high temperatures thus reducing the downtime of the epitaxial reactor. The unloading temperature may be, for example, in excess of 500° C., and may even reach 800-1000° C.; it is preferable to use tools made of quartz or silicon carbide for handling objects this hot.

In particular, the handling of substrates may include:
leaving the susceptor permanently in the chamber;
before growth, loading a substrate supporting element with a substrate to be treated (or a coupling between a substrate supporting element and a frame) into the chamber;
during growth, leaving the supporting element with the substrate (or the coupling) in the chamber; and
after growth, unloading the supporting element with the treated substrate (or the coupling) from the chamber.

Typically, when the supporting element (or the coupling) is loaded, it is lowered onto the susceptor, and when the supporting element (or the coupling) is unloaded, it is raised from the susceptor.

A susceptor may be adapted to house multiple substrates and thus multiple supporting elements (or couplings); therefore, each of the supporting elements (or the couplings) must be first loaded and then unloaded.

Fundamentally, there are three ways for automatically unloading a supporting element or an element+frame coupling while the susceptor body is inside the reaction chamber of the epitaxial reactor:
A) by means of mechanical traction and action from the top, for example on a corner of the raised edge (or of the frame),
B) by means of pneumatic suction and action from the top, for example on a flat surface of the raised edge (or of the frame),
C) by means of mechanical thrust and action from the bottom, for example on the protrusion of the raised edge (or of the frame);
naturally, loading is carried out in the opposite sense.

For example, method A is suitable for the solution shown in FIG. 10; the inner bevel may be used for the mechanical action on the corner of the supporting element of an appropriate tool.

For example, method B leans itself to the solutions shown in FIG. 11, FIG. 12 and FIG. 13; the wide upper surface of the edge of the supporting element may be used for the pneumatic action of an appropriate tool on the supporting element.

For example, method C leans itself to the solutions shown in FIG. 14, FIG. 15 and FIG. 16; an appropriate tool may operate from the bottom underneath the protrusion of the edge of the supporting element. For such a purpose, the tool may comprise, for example, two long fingers which by translating insinuate under the protrusion and are then lifted pushing the supporting element upwards.

As mentioned, similar considerations to those for handling the supporting elements apply to the handling of the frames.

The invention claimed is:

1. Susceptor for a reactor for epitaxial growth, comprising:
 a disc-shaped body having a first face and a second face, wherein said first face comprises at least one zone adapted to receive a substrate to be subjected to epitaxial growth, and
 at least one supporting element for said substrate placed at said zone;
 wherein said supporting element comprises a circular disc;
 wherein said zone is a bottom of a recess of said body or a top of a relief of said body;
 wherein said body is solid at least at said recess or relief;
 wherein the susceptor comprises further at least one frame for said at least one supporting element, said at least one frame providing an edge around said supporting element, said edge being raised with respect to said circular disc;
 wherein said at least one frame comprises a hole, and
 wherein said at least one frame is placed at said zone and said at least one supporting element is at least partially within said hole through insertion of said at least one supporting element in said hole;
 wherein a releasable coupling by insertion between said at least one supporting element and said at least one frame is arranged to be handled by acting on said at least one supporting element or on said at least one frame so to avoid disinsertion during handling.

2. Susceptor according to claim 1, wherein said circular disc is flat.

3. Susceptor according to claim 1, wherein said supporting element has an initial counter-curvature such that said circular disc is concave.

4. Susceptor according to claim 1, wherein said supporting element is entirely made of graphite or tantalum carbide or graphite coated with tantalum carbide.

5. Susceptor according to claim 4, wherein said supporting element is coated in part with silicon carbide.

6. Susceptor according to claim 1, wherein said supporting element exposes a resting surface for said substrate, wherein said resting surface is rough or rugged or knurled.

7. Susceptor according to claim 1, wherein said supporting element comprises further a circular edge which is raised with respect to said circular disc.

8. Susceptor according to claim 1, wherein said supporting element and/or said frame comprise a inner side with a surface which is partially cylindrical and partially flat.

9. Reactor for epitaxial growth comprising at least one susceptor for supporting and heating substrates according to claim 1.

10. Reactor for epitaxial growth according to claim 9, comprising a hot wall-type reaction chamber, wherein a wall of said reaction chamber has a recess adapted to contain said at least one susceptor both when it is stationary and when it is rotating.

11. Reactor for epitaxial growth according to claim 10, wherein said wall is solid at least at said recess.

12. Reactor for epitaxial growth according to claim 9, of the type for depositing layers of silicon carbide on said substrates and with induction heating.

13. Reactor for epitaxial growth according to claim 9, comprising protection elements for protecting side of said relief of said body from precursor gases.

14. Susceptor for a reactor for epitaxial growth, comprising:
 a disc-shaped body having a first face and a second face, wherein said first face comprises at least one zone adapted to receive a substrate to be subjected to epitaxial growth, and
 at least one supporting element for said substrate placed at said zone;
 wherein said supporting element comprises a circular disc;
 wherein said zone is a bottom of a recess of said body or a top of a relief of said body;
 wherein said body is solid at least at said recess or relief;
 wherein the susceptor comprises further at least one frame for said at least one supporting element, said at least one frame providing an edge around said supporting element, said edge being raised with respect to said circular disc;
 wherein said at least one frame comprises a hole, and
 wherein said at least one frame is placed at said zone and said at least one supporting element is partially within said hole through insertion of said at least one supporting element in a lower portion of said hole;
 wherein a releasable coupling by insertion between said at least one supporting element and said at least one frame is arranged to be handled by acting on a peripheral zone of said at least one supporting element so to avoid disinsertion during handling;
 wherein the circular disc is thicker at a central zone and thinner at said peripheral zone.

* * * * *